US011071210B2

(12) United States Patent
Klocek et al.

(10) Patent No.: US 11,071,210 B2
(45) Date of Patent: Jul. 20, 2021

(54) ANISOTROPIC ETCHING USING HIGHLY BRANCHED POLYMERS

(71) Applicant: AT&S Austria Technologie & Systemtechnik Aktiengesellschaft, Leoben (AT)

(72) Inventors: Jolanta Klocek, Leoben (AT); Thomas Krivec, Zeltweg (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/246,799

(22) Filed: Jan. 14, 2019

(65) Prior Publication Data

US 2019/0239357 A1 Aug. 1, 2019

(30) Foreign Application Priority Data

Jan. 29, 2018 (EP) ..................................... 18153959

(51) Int. Cl.
*H05K 3/06* (2006.01)
*C23F 1/16* (2006.01)

(52) U.S. Cl.
CPC .............. *H05K 3/067* (2013.01); *C23F 1/16* (2013.01); *H05K 2203/124* (2013.01); *H05K 2203/125* (2013.01)

(58) Field of Classification Search
CPC ............. H05K 3/067; H05K 2203/124; H05K 2203/125; C23F 1/16
USPC ........................................................ 174/257
See application file for complete search history.

(56) References Cited

U.S. PATENT DOCUMENTS

| 4,497,687 | A | 2/1985 | Nelson |
| 4,543,153 | A | 9/1985 | Nelson |
| 4,632,727 | A | 12/1986 | Nelson |
| 4,695,348 | A | 9/1987 | Battey et al. |
| 4,767,662 | A | 8/1988 | Battey et al. |
| 4,846,918 | A | 7/1989 | Nelson et al. |
| 4,859,281 | A | 8/1989 | Goltz |
| 6,156,221 | A | 12/2000 | Lauffer et al. |
| 6,733,886 | B2 | 5/2004 | Kawaguchi et al. |
| 7,150,820 | B2 | 12/2006 | Hu et al. |

(Continued)

FOREIGN PATENT DOCUMENTS

| CN | 205232594 U | 5/2016 |
| EP | 3 184 669 A1 | 6/2017 |

(Continued)

OTHER PUBLICATIONS

Antonijevic, M. M. et al.; Copper Corrosion Inhibitors. A Review; Int. J. Electrochem. Sci. 3 (2008); pp. 1-28.

(Continued)

*Primary Examiner* — Tremesha S Willis
(74) *Attorney, Agent, or Firm* — Robert A. Blaha; Smith Tempel Blaha LLC

(57) ABSTRACT

An etching composition for etching an electrically conductive layer structure for forming a conductor track is provided. The etching composition includes an etchant, a highly branched compound and optionally a solvent. In addition, a method of etching an electrically conductive layer structure, a conductor track, an arrangement of at least two conductor tracks, and a component carrier are provided.

20 Claims, 3 Drawing Sheets

(56) References Cited

U.S. PATENT DOCUMENTS

| | | |
|---|---|---|
| 2002/0043468 A1 | 4/2002 | Mikkola et al. |
| 2006/0199394 A1 | 9/2006 | Takahashi et al. |
| 2009/0170179 A1* | 7/2009 | Lynn .................. C08F 26/06 435/180 |
| 2010/0252530 A1 | 10/2010 | Durante et al. |
| 2010/0282712 A1* | 11/2010 | Ben-Moshe .......... C09D 11/03 216/97 |
| 2014/0262805 A1 | 9/2014 | Lützow et al. |
| 2015/0267305 A1 | 9/2015 | Choi et al. |
| 2015/0307999 A1 | 10/2015 | Lützow et al. |
| 2017/0015903 A1* | 1/2017 | Wang .................... C09K 13/00 |

FOREIGN PATENT DOCUMENTS

| | | |
|---|---|---|
| GB | 2206541 A | 1/1989 |
| JP | 2013167024 A | 8/2013 |
| KR | 20140082392 A | 7/2014 |

OTHER PUBLICATIONS

Gao C. et al.; Hyperbranched Polymers: From Synthesis to Applications; Progress in Polymer Science, vol. 29, No. 3, pp. 4-11.

Antonijević, M. et al.; Films Formed on Copper Surface in Chloride Media in the Presence of Azoles; Corrosion Science vol. 51, Issue 6, Jun. 2009, pp. 1228-1237; 2009 Elsevier Ltd. doi:10.1016/j.corsci.2009.03.026.

* cited by examiner

Ideal (anisotropic) etching process

ANISOTROPIC ETCHING USING HIGHLY BRANCHED POLYMERS

CROSS-REFERENCE TO RELATED APPLICATIONS

This application claims priority to European Patent Application No. 18 153 959.4, filed 29 Jan. 2018, the disclosure of which is hereby incorporated herein by reference in its entirety.

TECHNICAL FIELD

Embodiments of the present invention relate to an etching composition, a method of etching an electrically conductive layer structure (hereinafter, also simply referred to as an "etching process"), a conductor track, an arrangement of at least two conductor tracks, and a component carrier.

TECHNOLOGICAL BACKGROUND

In the context of growing product functionalities of component carriers equipped with one or more components and increasing miniaturization of such components as well as a rising number of components to be mounted on component carriers such as printed circuit boards (PCBs), increasingly more powerful array-like components or packages having several components are being employed, which have a plurality of contacts or connections, with ever smaller spacing between these contacts.

The PCB industry is in particular confronted with the task to adapt the size of the produced printed circuit boards to comply with the miniaturization requirements. Due to the new dimensions of the circuit paths, drill holes and their distance from each other, it is necessary to implement new etching techniques, in particular new copper etching processes. Although the copper etching process is one of the most important steps in the manufacture of printed circuit boards, processing of copper during fabrication is still a challenging task. In a conventional isotropic copper etching process as shown in FIG. 1, when a copper film to be etched formed on a substrate and partly covered by a mask (as a negative template for patterning) is etched, undercuts may be formed beneath the mask due to isotropic etching, resulting in poor adhesion. In addition, isotropic etching may not be capable of forming very fine etching structures, but isotropic etching may be blocked by respective, fine masks structures.

SUMMARY

There may be a need to provide an etching composition and an etching process allowing an anisotropic etching of an electrically conductive layer structure and/or allowing the formation of a conductor track having a substantially regular shape, in particular with substantially vertical side walls, thereby increasing the overall quality of a component carrier, such as a printed circuit board.

The generation of fine structures with circuit paths of 30 microns and below may require an anisotropic etching process. In case of printed circuit boards, it is desired that the etching (in particular the copper removal) occurs more in the vertical direction rather than in the lateral direction. Hereby, regular structures may be obtained and short circuits may be avoided.

An etching composition, a method of etching an electrically conductive layer structure, a conductor track, an arrangement of at least two conductor tracks, and a component carrier according to the independent claims are provided.

According to an exemplary embodiment of the invention, an etching composition for etching an electrically conductive layer structure for forming a conductor track is provided which comprises an etchant (an etching agent), a highly branched (hyperbranched) compound and optionally a solvent.

According to another exemplary embodiment of the invention, a method of etching an electrically conductive layer structure of a component carrier for forming a conductor track is provided, wherein the method comprises subjecting the electrically conductive layer structure to an etching composition as described herein.

According to still another exemplary embodiment of the invention, a conductor track having a substantially rectangular cross-section is provided, wherein a ratio between the cross-sectional area of an upper third and the cross-sectional area of a central third is in a range between 0.8 and 1.2 and a ratio between the cross-sectional area of the central third and the cross-sectional area of a lower third is in a range between 0.8 and 1.2. In an embodiment, the conductor track may be formed by means of an etching composition as described herein and/or by the method of etching as described herein.

According to yet another exemplary embodiment of the invention, an arrangement of a first conductor track and a laterally directly neighbored second conductor track both having a substantially rectangular cross-section is provided, wherein a ratio between a distance between upper plateaus of the conductor tracks and a distance between lower ends of the conductor tracks is in a range between 0.7 and 1.3. In an embodiment, the first conductor track and/or the second conductor track (in particular both conductor tracks) of the arrangement may be formed by means of an etching composition as described herein and/or by the method of etching as described herein.

According to yet another exemplary embodiment of the invention, a component carrier is provided which comprises a stack of at least one electrically insulating layer structure and at least one electrically conductive layer structure, wherein at least a part of at least one electrically conductive layer structure comprises a conductor track as described herein and/or an arrangement as described herein.

OVERVIEW OF EMBODIMENTS

In the context of the present application, the term "etching composition" may particularly denote a fluid, such as a solution or a liquid, which is capable of at least partly etching (dissolving) an electrically conductive material, such as a metal, in particular—but not limited to—copper, aluminum, nickel or silver. To this end, the etching composition may in particular comprise an etchant (etching agent) representing a reactive component of the composition substantially responsible for the at least partly etching (dissolving) an electrically conductive material.

According to an exemplary embodiment of the invention, an etching composition is provided comprising a highly branched compound which promotes an anisotropic etching of an electrically conductive layer structure so that conductor tracks may be formed having a substantially regular shape, in particular with substantially vertical side walls. Without wishing to be bound to any theory, it is believed that the various branches of the highly branched compound render the compound very space-consuming or bulky thereby providing a steric hinder effect so that the highly branched compound may not reach (or is at least limited in reaching) the bottom of a recess (cavity) formed in the electrically conductive layer structure during etching (i.e. an etched structure). Rather, the highly branched compound may be stuck between the side walls of the etched structure, thereby protecting or shielding the side walls from the etchant and suppressing a further etching in a lateral direction. In addition, it is believed that small etchant molecules may pass through the highly branched compound and may thus reach the bottom of the etched structure thereby promoting that the etching proceeds in a vertical direction. It may even be possible that a concentration gradient of the etchant occurs within the recess formed in the electrically conductive layer structure during etching wherein the concentration of the etchant near the bottom is higher than the concentration of the etchant at the top or in the middle of the etched structure. As a result, an anisotropic etching may be achieved.

In the following, further exemplary embodiments of the etching composition, the method of etching an electrically conductive layer structure, the conductor track, the arrangement of at least two conductor tracks, and the component carrier will be explained. However, the present invention is not limited to the following specific descriptions of exemplary embodiments, but they are rather for illustrative purposes only.

It should be noted that features described in connection with one exemplary embodiment or exemplary aspect may be combined with any other exemplary embodiment or exemplary aspect, in particular features described with any exemplary embodiment of an etching composition may be combined with any other exemplary embodiment of an etching composition and any exemplary embodiment of a method of etching an electrically conductive layer structure, a conductor track, an arrangement of at least two conductor tracks, and a component carrier and vice versa, unless specifically stated otherwise.

Where an indefinite or definite article is used when referring to a singular term, such as "a", "an" or "the", a plural of that term is also included and vice versa, unless specifically stated otherwise, whereas the word "one" or the number "1", as used herein, typically means "just one" or "exactly one".

It should be noted that the term "comprising" does not exclude other elements or steps and, as used herein, includes not only the meaning of "comprising", "including" or "containing", but also encompasses "consisting essentially of" and "consisting of".

Unless specifically stated otherwise, the expressions "at least partially", "at least partly", "at least part of" or "at least a part of", as used herein, may mean at least 1% thereof, in particular at least 5% thereof, in particular at least 10% thereof, in particular at least 15% thereof, in particular at least 20% thereof, in particular at least 25% thereof, in particular at least 30% thereof, in particular at least 35% thereof, in particular at least 40% thereof, in particular at least 45% thereof, in particular at least 50% thereof, in particular at least 55% thereof, in particular at least 60% thereof, in particular at least 65% thereof, in particular at least 70% thereof, in particular at least 75% thereof, in particular at least 80% thereof, in particular at least 85% thereof, in particular at least 90% thereof, in particular at least 95% thereof, in particular at least 98% thereof, and may also include 100% thereof.

In an embodiment, the etching composition is a solution or a liquid. Such etching composition may be suitably used in a wet etching process. The etching composition may be prepared by dissolving the various ingredients, such as an etchant and a highly branched compound, in an appropriate solvent, such as water and/or an organic solvent.

In an embodiment, the etchant comprises at least one of cupric chloride ($CuCl_2$) and ferric chloride ($FeCl_3$). Alternatively, an alkaline etchant may be employed, too. It might be advantageous that the etchant comprises cupric chloride ($CuCl_2$), in particular when the etching composition is intended for etching an electrically conductive layer structure for forming a conductor track of a component carrier.

In the context of the present application, the term "highly branched compound" may particularly denote a macromolecule, in particular an organic macromolecule, having several branching points (branches, furcations), such as more than 5, in particular more than 10, in particular more than 20, in particular more than 30, branching points and typically not more than 5000, such as not more than 1000 branching points. A "branching point" may be characterized by a carbon atom having (bound) three or four groups comprising more than one atom, in particular more than two atoms. More specifically, a "branching point" may be characterized by a carbon atom having (bound) three or four carbon atoms. However, a "branching point" may also be characterized by another atom (other than carbon, such as a nitrogen atom or a phosphorous atom) having (bound) three or four groups comprising more than one atom, in particular more than two atoms. In addition, a "highly branched compound" may be characterized by a large number of end groups (terminal groups), in particular functional end groups, such as hydroxy groups, thiol groups or amine groups. A "highly branched compound" may also be referred to as a "repetitively branched molecule", a "dendritic compound" or a "tree-like compound". A highly branched compound may in particular be a non-linear compound, in particular a non-linear macromolecule.

In an embodiment, the highly branched compound is selected from the group consisting of hyperbranched polymers, dendrons, dendrimers and multifunctional polyethylene glycols.

In the context of the present application, the term "hyperbranched polymer" may particularly denote a highly branched compound comprising one or more types of randomly branched repeating units (derived from respective monomers). Thus, the term "hyperbranched polymer" may also include a copolymer compound or a mixture of polymer and copolymer compounds. An illustrative example for a hyperbranched polymer is depicted in the following:

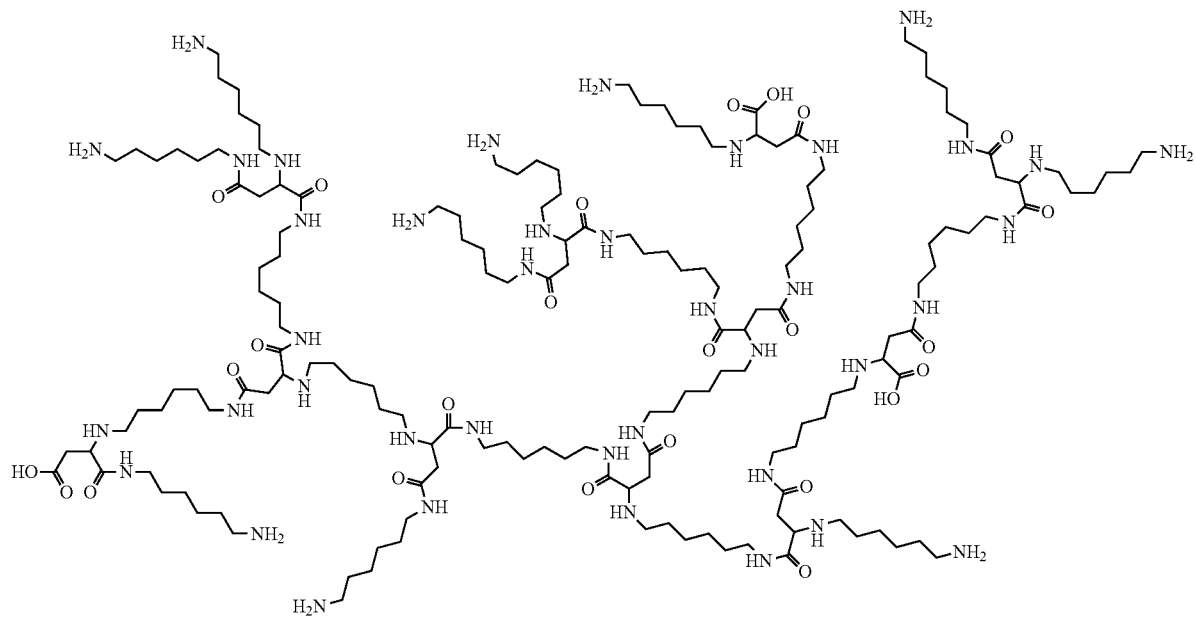

In the context of the present application, the term "dendron" may particularly denote a regularly, but incompletely branched compound typically having a focal point (or chemically addressable group). It may comprise one or more types of repeating units. Illustrative examples for dendrons are depicted in the following, wherein an amine dendron (i.e., a dendron having an amine focal point) is shown on the left and a thiol dendron (i.e., a dendron having a thiol focal point) is shown on the right of the following:

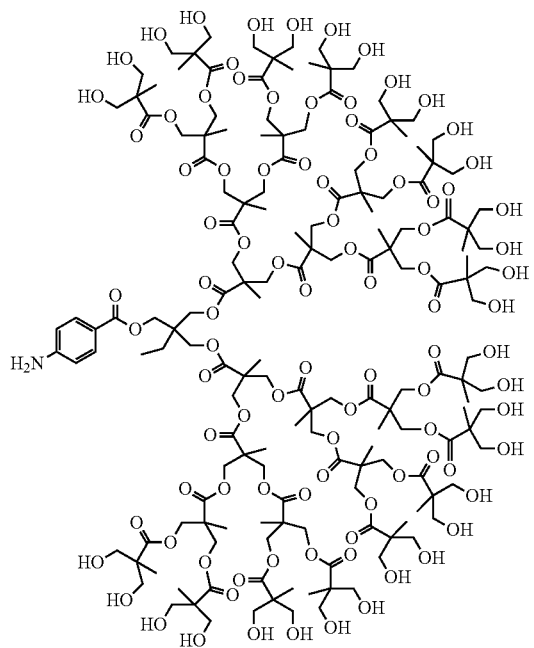

-continued

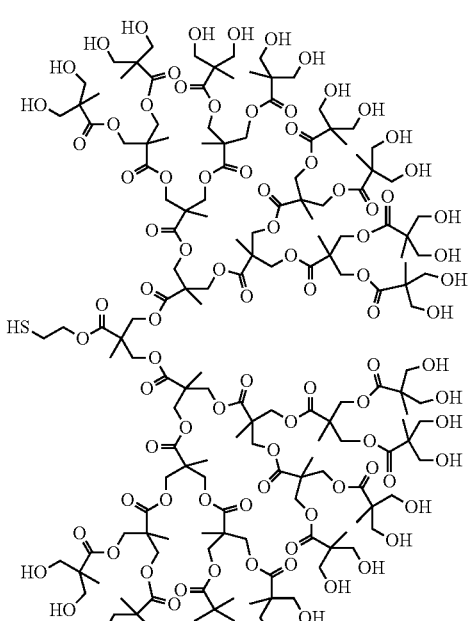

In the context of the present application, the term "dendrimer" may particularly denote a (substantially) regularly branched compound typically having a star-like topology or a spherical three-dimensional morphology. It may comprise one or more types of repeating units. An illustrative example for a dendrimer is depicted in the following:

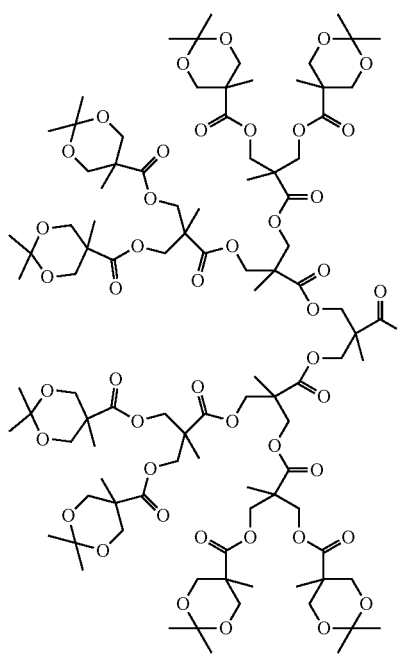
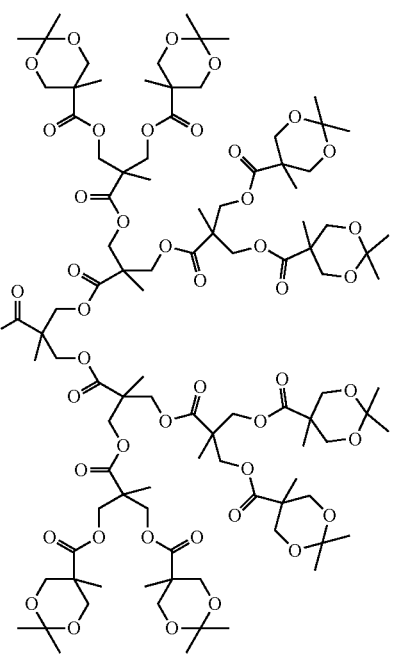

In the context of the present application, the term "multifunctional polyethylene glycol" may particularly denote a highly branched polyethylene glycol (PEG) having several functional end groups, in particular hydroxy groups. A "multifunctional polyethylene glycol" may also be referred to as a "multifunctional polyethylene oxide" or a "multifunctional polyoxyethylene". An illustrative example for a multifunctional polyethylene glycol is depicted in the following:

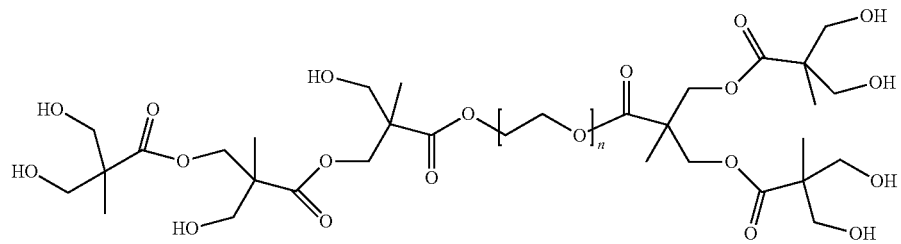

In an embodiment, the highly branched compound comprises at least one of an amine functional group and/or a thiol functional group. These functional groups may represent terminal functional groups. Alternatively, or additionally, these functional groups may represent focal points, as illustrated by an amine dendron and/or a thiol dendron depicted in the foregoing. A highly branched compound comprising at least one of an amine functional group and/or a thiol functional group may be particularly advantageous in that it may adhere—via its functional group—to a side wall surface of a recess formed in the electrically conductive layer structure during etching (i.e., an etched structure), thereby further increasing a side wall shielding or protecting effect of the highly branched compound so that an etching in a lateral direction may be further inhibited.

In an embodiment, the highly branched compound is (chemically) inert, in particular resistant to the etchant and to a low pH (acidic environment). In particular, it might be advantageous if the highly branched compound may not react with the etchant and may not degrade in an acidic environment.

In an embodiment, the highly branched compound is permeable for the etchant. For instance, a space between neighbored branches or strands of the highly branched compound may be larger than a size of the etchant (including any solvate shell thereof). In this situation, while the highly branched compound may not reach or may be limited in reaching the bottom of a recess formed in the electrically conductive layer structure during etching due to steric hindrance, small etchant molecules may pass through the highly branched compound and may thus reach the bottom of the etched structure where they may exert their etching activity without (steric) hindrance by the highly branched compound, thereby promoting that the etching proceeds in a vertical direction of the etched structure.

In an embodiment, the highly branched compound is contained in the etching composition in a concentration of from 0.001 g/l to 10 g/l, in particular of from 0.01 g/l to 5 g/l.

In an embodiment, the etching composition comprises a solvent, such as water and/or an organic solvent. In an embodiment, the solvent allows for a (substantially complete) dissolution of the various ingredients of the etching composition, such as the etchant and the highly branched compound.

In an embodiment, the etching composition further comprises an etching inhibitor. Advantageously, the etching inhibitor has a larger size than a size of the etchant and/or a larger size than a space between neighbored or neighboring branches or strands of the highly branched compound. Thus, it may be advantageous that the highly branched compound is at least less permeable for the etching inhibitor than for the etchant and/or that the highly branched compound is substantially impermeable for the etching inhibitor. In this situation, while the etchant may pass through the highly branched compound and may thus reach the bottom of the etched structure where it may exert its etching activity, the etching inhibitor may not pass through the highly branched compound or may pass the highly branched compound to a lower degree than the etchant and may thus inhibit an etching at the side walls of the etched structure, but not (or at least to a lower degree) an etching at the bottom of the etched structure. In other words, a concentration gradient of an etching inhibitor within the etched structure with a higher concentration thereof at the top rather than at the bottom of the etched structure may be achieved which promotes an etching in a vertical direction, but suppresses an etching in a lateral direction. As a result, the anisotropy of the etching may be further increased.

In an embodiment, the etching inhibitor (and/or chelating agent) may be selected depending on the specific etchant employed. For example, in case the etchant comprises cupric chloride, a complexing (or chelating) agent for $Cu^{2+}$ ions may be appropriate, whereas in case the etchant comprises ferric chloride, a complexing (or chelating) agent for $Fe^{3+}$ ions may be appropriate.

In an embodiment, examples of the etching inhibitor may include azoles, amines, amino acids, triphenylmethanes, thiols, organic phosphates and various other organic compounds, such as xanthates, phthalazines, phthalimides, polyphenols, uracils, purines and anilines. In an embodiment, the etching inhibitor may comprise an azole.

In an embodiment, examples of azole etching inhibitors include thiazoles, thiadiazoles, imidazoles, triazoles, and tetrazoles. Examples of amine etching inhibitors include secondary amines and diamines. Examples of amino acid etching inhibitors include cysteine and tryptophan. Examples of triphenylmethane etching inhibitors include fuchsine or rosaniline hydrochloride. Examples of amine etching inhibitors include dithiols. Examples of organic phosphate etching inhibitors include trimethyl phosphate and triphenylphosphate.

In an embodiment, the etching composition may comprise a mixture of different etching inhibitors (for example at least two etching inhibitors), such as etching inhibitors having different sizes and/or having different permeation rates through the highly branched compound. For example, it might be advantageous to include an etching inhibitor, which may not pass through the highly branched compound and which may thus be configured for inhibiting an etching at the side walls of the etched structure, and another etching inhibitor, which may at least partly pass through the highly branched compound and which may thus be configured for controlling an etching at the bottom of the etched structure, for instance by adjusting the etching activity of the etchant.

In an embodiment, the etching inhibitor is contained in the etching composition in a concentration of from 0.001 g/l to 10 g/l, in particular of from 0.01 g/l to 5 g/l.

In an embodiment, the etching composition further comprises a wetting additive. Hereby, an exchange of components on surfaces may be improved.

In an embodiment, the wetting agent is a surface-active agent, such as a surfactant. The surfactant may be at least one selected from the group consisting of an anionic surfactant, a cationic surfactant, a nonionic surfactant and a zwitterionic surfactant. In particular, the surfactant may be at least one selected from the group consisting of an anionic surfactant, a cationic surfactant and a nonionic surfactant. More specifically, the surfactant may be at least one of an anionic surfactant and a cationic surfactant and even more specifically the surfactant may comprise an anionic surfactant.

In an embodiment, the surfactant comprises at least one of a phosphor atom, a nitrogen atom and a sulphur atom. In particular, the surfactant may comprise one or more functional groups containing a phosphor atom, a nitrogen atom and/or a sulphur atom. A surfactant comprising such functional group may additionally protect or shield the side walls (of a recess formed in the electrically conductive layer structure during etching) from the etchant and may further suppress that the etching proceeds in a lateral direction.

In an embodiment, the wetting agent is contained in the etching composition in a concentration of from 0.001 g/l to 10 g/l, in particular of from 0.01 g/l to 5 g/l.

In an embodiment, the etching composition further comprises a rheological additive. In the context of the present application, the term "rheological additive" may particularly denote a compound capable of modifying the rheological behavior of the etching composition. The rheological additive may comprise an organic compound and/or an inorganic compound.

In an embodiment, the rheological additive is selected from the group consisting of silica, hydroxyethyl cellulose, phyllosilicates and urea. The silica may in particular be a hydrophilic and/or pyrogenic and/or amorphous silica, such as HDK N20 (commercially available from Wacker Chemie AG, München, Germany). The hydroxyethyl cellulose may in particular be a water-soluble hydroxyethyl cellulose, such as Natrosol 250 HHBR or Natrosol 250 HHX (commercially available from Ashland Inc., Covington, Ky., USA). The phyllosilicate may in particular be a hydrated phyllosilicate, such as Optigel WX (commercially available from Byk-Chemie GmbH, Wesel, Germany). The urea may in particular be a modified urea, such as Byk-7420 ES (commercially available from Byk-Chemie GmbH, Wesel, Germany).

Without wishing to be bound to any theory, the following is assumed: Based on the theory of spray-etching, the flow of an etching composition is more turbulent in the middle or center of an etched structure so that the liquid is more agitated there than at the side walls of the structure to be etched. In this situation, the addition of a rheological additive to the etching composition may cause an increase in density and/or in viscosity of the etching composition near to the side walls in comparison to the middle of the structure. As a general rule, the lower the density and/or the viscosity of the etching composition, the easier a component exchange between the etching liquid and the etched surface (for instance made of copper). As a consequence, the addition of a rheological additive may result in a higher etching speed in a vertical direction and a lower etching speed in a horizontal direction, thereby further increasing the anisotropy of the etching process and the resulting etched structures.

In an embodiment, the rheological additive is contained in the etching composition in a concentration of from 0.001 g/l to 10 g/l, in particular of from 0.01 g/l to 5 g/l.

In an embodiment, the method of etching an electrically conductive layer structure of a component carrier for forming a conductor track comprises subjecting the electrically conductive layer structure to an etching composition as described herein. In particular, the method of etching may be a wet etching process.

In an embodiment, the electrically conductive layer structure is subjected to a subtractive etching procedure for forming the conductor track, in particular a subtractive wet etching procedure for forming the conductor track. Thus, the etching process may be a subtractive etching process.

In an embodiment, the subjecting the electrically conductive layer structure to the etching composition comprises a spraying the etching composition on (a surface of) the electrically conductive layer structure.

In an embodiment, subsequent to subjecting the electrically conductive layer structure to the etching composition, the (etched) electrically conductive layer structure may be subjected to a rinsing liquid.

In an embodiment, the rinsing liquid comprises a compound configured for adjusting a porosity of an etched surface and/or for protecting a (copper) surface from interaction with air (in the following referred to as "rinsing liquid additive").

In an embodiment, the rinsing liquid additive may be selected from the group consisting of ethoxylated amides, (ethoxylated) amines, fatty acids, phosphonic acid esters, alkanolamine phosphonates and dispersing agents.

In an embodiment, the conductor track having a substantially rectangular cross-section is characterized by a ratio between the cross-sectional area of an upper third and the cross-sectional area of a central third being in a range between 0.8 and 1.2, in particular between 0.85 and 1.15, in particular between 0.9 and 1.1, in particular between 0.93 and 1.07, in particular between 0.94 and 1.06, in particular between 0.95 and 1.05, and a ratio between the cross-sectional area of the central third and the cross-sectional area of a lower third being in a range between 0.8 and 1.2, in particular between 0.85 and 1.15, in particular between 0.9 and 1.1, in particular between 0.93 and 1.07, in particular between 0.94 and 1.06, in particular between 0.95 and 1.05.

In an embodiment, the conductor track may be further characterized by a ratio between the cross-sectional area of an upper third and the cross-sectional area of a lower third being in a range between 0.7 and 1.3, in particular between 0.8 and 1.2, in particular between 0.9 and 1.1 in particular between 0.92 and 1.08, in particular between 0.94 and 1.06.

In an embodiment, the conductor track may be formed by means of an etching composition as described herein and/or by the method of etching as described herein.

In the context of the present application, the term "cross-sectional area" of an upper, central and lower third, respectively, may particularly denote the cross-sectional area of a conductor track when cut in a vertical direction and horizontally subdivided in three thirds of equal heights, as it will be further apparent from the illustration of FIG. 5 and the corresponding explanations below.

In the context of the present application, the term "substantially rectangular cross-section" may particularly denote that at least one, in particular at least two, of the above described cross-sectional area ratios lies within the respective above described range(s). Alternatively, or additionally, the term "substantially rectangular cross-section" may denote that the distance ratio as described in the following lies within a range as described in the following.

In an embodiment, the arrangement of a first conductor track and a laterally directly neighbored second conductor track both having a substantially rectangular cross-section is characterized by a ratio between a distance between upper plateaus of the conductor tracks and a distance between lower ends of the conductor tracks being in a range between 0.7 and 1.3, in particular between 0.8 and 1.2, in particular between 0.85 and 1.15, in particular between 0.9 and 1.1, in particular between 0.92 and 1.08, in particular between 0.95 and 1.05.

In an embodiment, the distance between upper plateaus of the conductor tracks and/or the distance between lower ends of the conductor tracks may be lower than 50 µm, such as 30 µm or less.

In an embodiment, the first conductor track and/or the second conductor track (in particular both conductor tracks) of the arrangement may be formed by means of an etching composition as described herein and/or by the method of etching as described herein.

In an embodiment, the component carrier comprises a stack of at least one electrically insulating layer structure and at least one electrically conductive layer structure, wherein at least a part of at least one electrically conductive layer structure comprises a conductor track as described herein and/or an arrangement as described herein.

In an embodiment, the part of the at least one electrically conductive layer structure comprising the conductor track and/or the arrangement may be at least partly exposed.

In an embodiment, the part of the at least one electrically conductive layer structure comprising the conductor track and/or the arrangement may be at least partly sandwiched between two electrically insulating layers and/or at least partly embedded within one electrically insulating layer structure.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "electronic component" may particularly denote any bulky rather than layer-type active (such as a semiconductor chip) or passive (for instance a copper block) component embedded within an interior of the component carrier.

In an embodiment, the component may be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the component carrier is a laminate-type component carrier. In such an embodiment, the component carrier is a compound of multiple layer structures which are stacked and connected together by applying a pressing force, if desired accompanied by heat.

In an embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the at least one electrically conductive layer structure, in particular the at least one electrically conductive layer structure comprising the conductor track and/or the arrangement, comprises at least one of the group consisting of copper, aluminum, nickel and silver.

DETAILED DESCRIPTION OF ILLUSTRATED EMBODIMENTS

Figure 1:
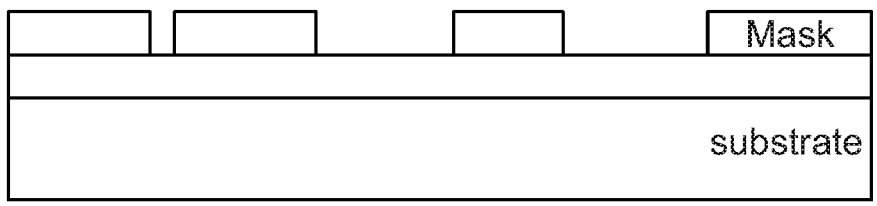
FIG. 1 illustrates a conventional isotropic copper etching process according to the prior art.
Figure 1:
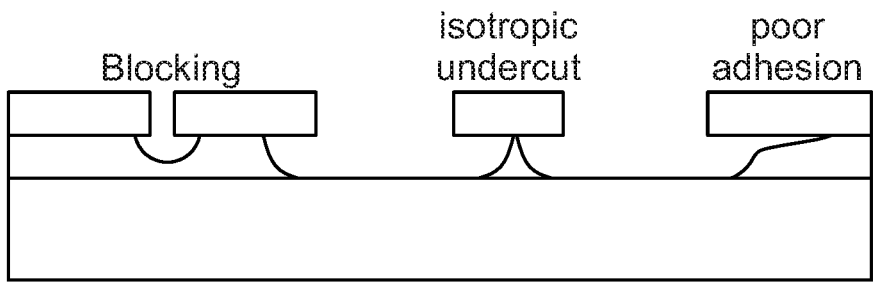

The aspects defined above and further aspects of the invention are apparent from the exemplary embodiments to be described hereinafter and are explained with reference to these exemplary embodiments.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, an etching composition is provided comprising a highly branched compound which promotes an anisotropic etching of an electrically conductive layer structure so that conductor tracks may be formed having a substantially regular shape, in particular with substantially vertical side walls. Without wishing to be bound to any theory, it is believed that the various branches of the highly branched compound render the compound very space-consuming thereby providing a steric hinder effect so that the highly branched compound may not reach (or is at least limited in reaching) the bottom of a recess formed in the electrically conductive layer structure during etching (i.e. an etched structure), but it may be stuck between the side walls of the etched structure, thereby protecting or shielding the side walls from the etchant and suppressing a further etching in a lateral direction. In addition, it is believed that small etchant molecules may pass through the highly branched compound and may thus reach the bottom of the etched structure thereby promoting that the etching proceeds in a vertical direction. It may even be possible that a concentration gradient of the etchant occurs within the recess formed in the electrically conductive layer structure during etching wherein the concentration of the etchant near the bottom is higher than the concentration of the etchant at the top or in the middle of the etched structure. As a result, an anisotropic etching may be achieved. The anisotropy of the etching may be further increased by adding an etching inhibitor to the etchant composition which may not pass through the highly branched compound. Hereby, a further etching at the side walls of the etched structure (i.e. in a lateral direction) may be substantially prevented (avoiding the formation of undercuts), whereas the etching at the bottom of the etched structure (i.e. in a vertical direction) is not inhibited. The highly branched compound may thus act as a filter or semipermeable barrier causing a concentration gradient of the etchant (with a higher concentration thereof at the bottom rather than at the top of the etched structure) and an opposite (or inverse) concentration gradient of an etching inhibitor (with a higher concentration thereof at the top rather than at the bottom of the etched structure) so that the etching mainly proceeds in a vertical direction rather than in a lateral direction. As a result, the overall quality of a component carrier, such as a printed circuit board, may be increased, in particular in terms of a decreased defect rate as well as an improved etching distribution (increased homogeneity) within the produced boards and a higher etching factor of etched structures. In addition, a line width lower than 50 µm, such as 30 µm or less, may be achieved.

Figure 2:
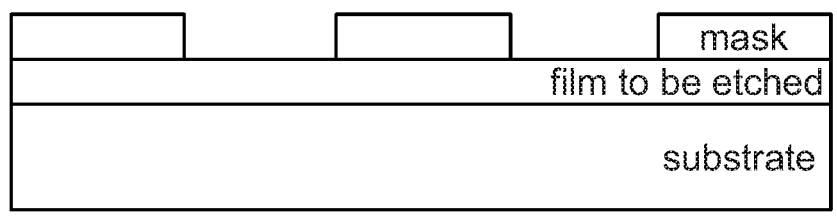
FIG. 2 illustrates an ideal anisotropic copper etching process according to an exemplary embodiment of the invention.
Figure 2:
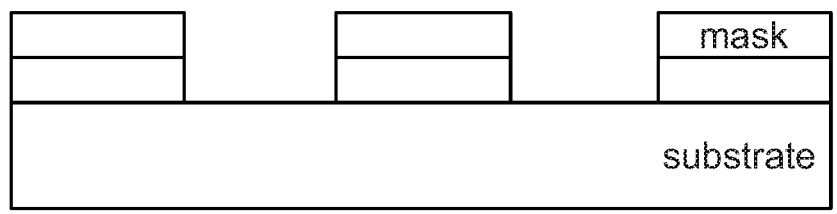

An ideal anisotropic etching process is shown in FIG. 2, wherein the etching exclusively occurs in the vertical direction, but not in the lateral direction of the PCB so that no undercuts are formed.

Figure 3:
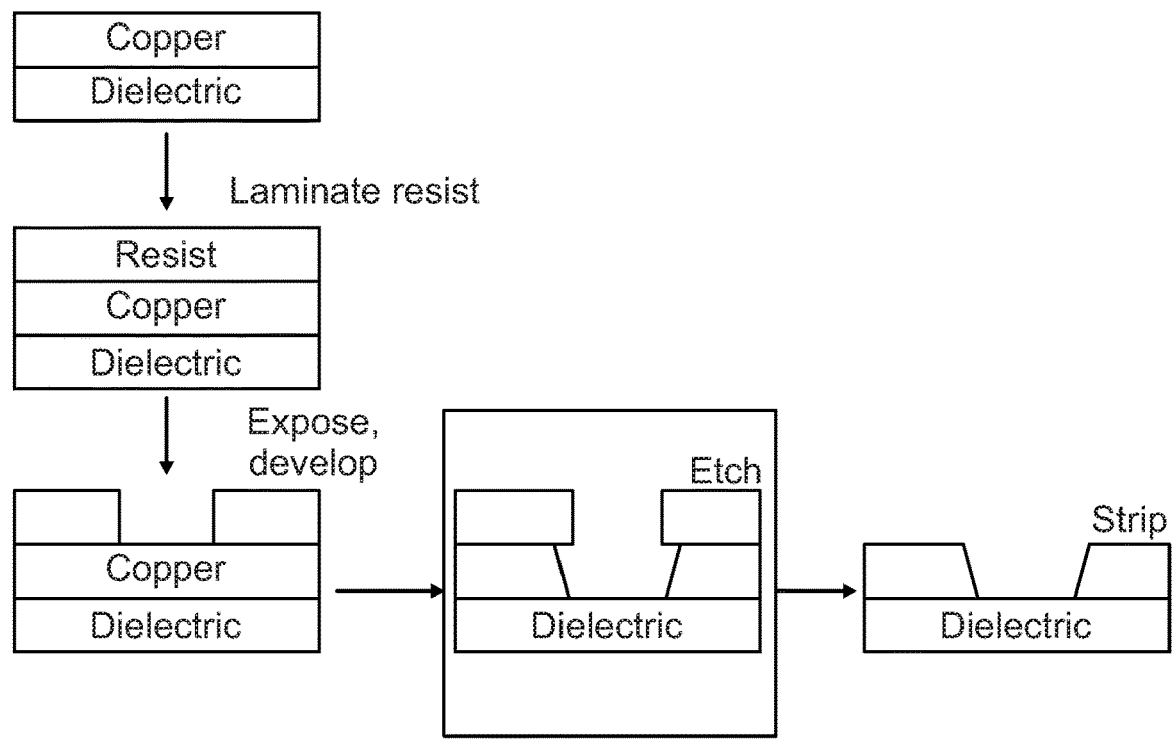
FIG. 3 illustrates a photolithographic structuring of an electrically conductive layer structure of a component carrier by means of a photoresist involving a subtractive etching process according to an exemplary embodiment of the invention.

FIG. 3 illustrates a photolithographic structuring of an electrically conductive layer structure of a component carrier by means of a photoresist involving a subtractive etching process according to an exemplary embodiment of the invention. In a first step, a laminate or stack of an electrically insulating layer structure (such as made of a dielectric) and an electrically conductive layer structure (such as made of copper) to be etched is provided. Next, a photoresist layer is applied on the electrically conductive layer structure. Then, the photoresist is partly exposed (through a mask, not shown) to electromagnetic radiation (such as UV light) and developed, thereby removing that part of the photoresist that has been exposed to the electromagnetic radiation. In the next step, a subtractive etching step according to an exemplary embodiment of the method of etching of the invention is performed (highlighted by a frame). Hereby, the electrically conductive layer structure is anisotropically etched so that the side walls of a recess formed in the electrically conductive layer structure are substantially vertical, even though a slight undercut beneath the photoresist is shown in FIG. 3. Finally, the remaining photoresist (such as that part of the photoresist that has not been exposed to the electromagnetic radiation before) is removed, for instance stripped off, and an arrangement of conductor tracks according to an exemplary embodiment of the invention on the dielectric is obtained.

Figure 4:
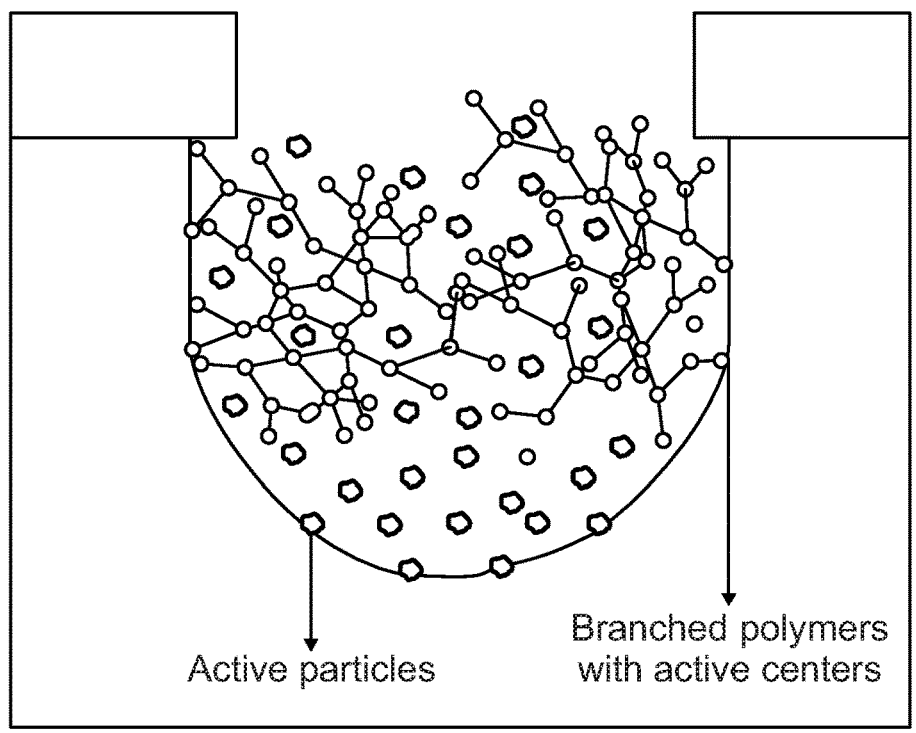
FIG. 4 represents an enlarged view of the etching step shown in FIG. 3 according to an exemplary embodiment of the invention.

FIG. 4 represents an enlarged view of the etching step highlighted by the frame in FIG. 3 according to an exemplary embodiment of the invention. The etching composition shown in FIG. 4 comprises "active particles" (i.e., an etchant) and "branched polymers with active centers" (i.e., a highly branched compound). As can be taken from FIG. 4, the highly branched compound is very bulky or space-consuming so that it may not reach the bottom of a recess formed in the electrically conductive layer structure during etching. Rather, in the embodiment shown in FIG. 4, the highly branched compound is stuck between the side walls of the etched structure. In addition, the highly branched compound adheres to a side wall surface of the recess via interaction between "active centers" (such as an amine functional group and/or a thiol functional group) of the highly branched compound and the side wall surface. As a result, the highly branched compound may effectively shield and protect the side walls from the etchant and suppress a further etching in a lateral direction. On the other hand, the active particles may pass through the highly branched compound and may thus reach the bottom of the etched structure where they come in contact with a bottom surface and exert their etching activity there. As a result, the etching proceeds in a vertical direction. As further shown in FIG. 4, a concentration gradient of the etchant is formed within the etched structure with a higher concentration of the etchant near the bottom compared to the concentration of the etchant at the top or in the middle of the etched structure.

Figure 5:
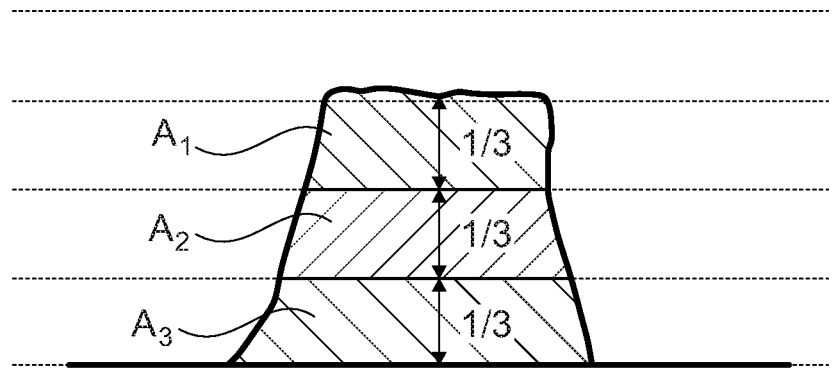
FIG. 5 illustrates a cross-sectional view of a conductor track according to an exemplary embodiment of the invention.

Referring to FIG. 5, a cross-sectional view of a conductor track having a substantially rectangular cross-section according to an exemplary embodiment of the invention is shown. In particular, the cross-sectional view shown in FIG. 5 is a cross-sectional view in vertical direction of the conductor track, i.e. a view of the conductor track when cut in a vertical direction. In addition, as depicted in FIG. 5, the conductor track is horizontally subdivided in three thirds of equal heights. As a result, a cross-sectional area of an upper third (A1), a cross-sectional area of a central third (A2) and a cross-sectional area of a lower third (A3) are obtained. The conductor track according to an exemplary embodiment is characterized by a ratio between the cross-sectional area of the upper third (A1) and the cross-sectional area of a central third (A2) being in a range between 0.8 and 1.2 and a ratio between the cross-sectional area of the central third (A2) and the cross-sectional area of the lower third (A3) being in a range between 0.8 and 1.2. In an embodiment, the conductor track may be further characterized by a ratio between the cross-sectional area of the upper third (A1) and the cross-sectional area of the lower third (A3) being in a range between 0.7 and 1.3.

Figure 6:
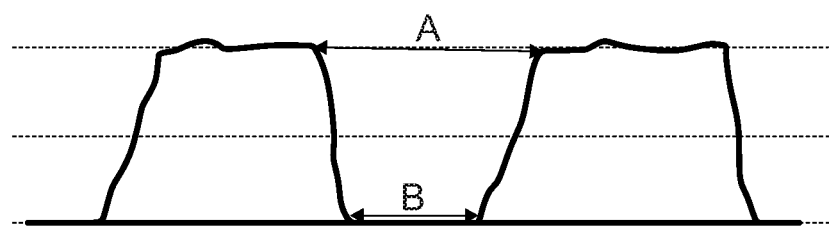
FIG. 6 illustrates a cross-sectional view of an arrangement of conductor tracks according to an exemplary embodiment of the invention.

Referring to FIG. 6, a cross-sectional view of an arrangement of conductor tracks according to an exemplary embodiment of the invention is shown. In particular, the cross-sectional view shown in FIG. 6 is a cross-sectional view in vertical direction of the arrangement of conductor tracks, i.e., a view when the conductor tracks were cut in a vertical direction. FIG. 6 depicts a first conductor track (for instance the conductor track on the left) and a second conductor track (for instance the conductor track on the right). FIG. 6 further depicts an arrowed line, A, representing a distance between upper plateaus of the conductor tracks and an arrowed line, B, representing a distance between lower ends of the conductor tracks. The arrangement of conductor tracks according to an exemplary embodiment is characterized by a ratio between the distance A between upper plateaus of the conductor tracks and the distance B between lower ends of the conductor tracks being in a range between 0.7 and 1.3. The distance A and/or the distance B may be for instance lower than 50 µm, such as 30 µm or less.

It should be noted that reference signs in the claims shall not be construed as limiting the scope of the claims.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. An etching composition for etching an electrically conductive layer structure for forming a conductor track, the etching composition comprising:
    an etchant;
    a highly branched non-linear compound, wherein the highly branched non-linear compound comprises at least one of an amine functional group and/or a thiol functional group;
    an etching inhibitor; and
    optionally a solvent,
    wherein the highly branched non-linear compound is less permeable for the etching inhibitor than for the etchant.
2. The etching composition according to claim 1, wherein the etchant comprises at least one of cupric chloride ($CuCl_2$) and ferric chloride ($FeCl_3$).
3. The etching composition according to claim 1, wherein the highly branched compound is selected from the group consisting of hyperbranched polymers, dendrons, dendrimers and multifunctional polyethylene glycols.
4. The etching composition according to claim 1, wherein the highly branched compound is permeable for the etchant.
5. The etching composition according to claim 1,
    wherein the etching inhibitor comprises molecules that are larger than a space between neighboring branches of the highly branched compound.
6. The etching composition according to claim 1, further comprising:
    a wetting additive.
7. The etching composition according to claim 1, further comprising:
    a rheological additive.
8. The etching composition according to claim 7, wherein the rheological additive is selected from the group consisting of silica, hydroxyethyl cellulose, phyllosilicates and urea.
9. A method of etching an electrically conductive layer structure of a component carrier for forming a conductor track, the method comprising:
    providing an electrically conductive layer structure; and
    subjecting the electrically conductive layer structure to an etching composition having an etchant, a highly branched non-linear compound, a first etching inhibitor and optionally a solvent, wherein the highly branched non-linear compound comprises at least one of an amine functional group and/or a thiol functional group, wherein the highly branched non-linear compound is less permeable for the first etching inhibitor than for the etchant.
10. The method according to claim 9, wherein the electrically conductive layer structure is made subject to a subtractive etching procedure for forming the conductor track.
11. The etching composition according to claim 1,
    wherein a branching point is characterized by an atom with bound groups of more than one atom.
12. The etching composition according to claim 11, wherein the atom is nitrogen.
13. The etching composition according to claim 11, wherein the atom is phosphorous.
14. The method according to claim 9, wherein the highly branched non-linear compound promotes an anisotropic etching.
15. The method according to claim 14, wherein the anisotropic etching provides a structure for forming the conductor track with a substantially regular shape.
16. The method according to claim 9, wherein the highly branched non-linear compound provides a steric hinder effect.
17. The method according to claim 9, wherein the highly branched non-linear compound is capable of being stuck between opposing walls of an etched structure.
18. The method of claim 9,
    wherein the etching inhibitor comprises molecules that are larger than a space between neighboring branches of the highly branched non-linear compound.
19. The method of claim 9, introducing a second etching inhibitor different from the first inhibitor, wherein the first etching inhibitor may not pass through the highly branched non-linear compound and wherein the second etching inhibitor may at least partially pass through the highly-branched nonlinear compound.

20. The method of claim 9, wherein the etching inhibitor is in a concentration of from 0.001 g/l to 10 g/l in the etching composition.

* * * * *